United States Patent [19]

Okuzawa

[11] Patent Number: 5,517,451
[45] Date of Patent: May 14, 1996

[54] SEMICONDUCTOR MEMORY DEVICE AND MEMORY INITIALIZING METHOD

[75] Inventor: Kiyotaka Okuzawa, Tsukuba, Japan

[73] Assignee: Texas Instruments Incorporated, Dallas, Tex.

[21] Appl. No.: 186,186

[22] Filed: Jan. 24, 1994

[30] Foreign Application Priority Data

Jan. 22, 1993 [JP] Japan .................... 5-027335

[51] Int. Cl.$^6$ .................................. G11C 29/00
[52] U.S. Cl. .................. 365/203; 365/201; 365/190; 365/189.01
[58] Field of Search ................... 365/203, 204, 365/202, 189.01, 201, 207, 190

[56] References Cited

U.S. PATENT DOCUMENTS

| | | | |
|---|---|---|---|
| 4,817,057 | 3/1989 | Kondo et al. | 365/203 |
| 4,984,215 | 1/1991 | Ushida | 365/230.06 |
| 4,996,671 | 2/1991 | Suzuki et al. | 365/203 |
| 5,010,523 | 4/1991 | Yamauchi | 365/203 |
| 5,091,889 | 2/1992 | Hamano et al. | 365/203 |
| 5,245,579 | 9/1993 | Ohta | 365/204 |
| 5,247,482 | 9/1993 | Kim | 365/203 |
| 5,267,215 | 11/1993 | Tsujimoto | 365/203 |
| 5,301,157 | 4/1994 | Roberts | 365/203 |
| 5,325,337 | 6/1994 | Buttar | 365/203 |
| 5,377,151 | 12/1994 | Komuro | 365/203 |
| 5,404,325 | 4/1995 | Shibata | 365/203 |

*Primary Examiner*—Tan T. Nguyen
*Attorney, Agent, or Firm*—William E. Hiller; Richard L. Donaldson

[57] ABSTRACT

A semiconductor memory device and an initialization method therefor, wherein writing of the initialization data into memory cells of the semiconductor memory device can be performed in a simple way in a short period of time. When initialization is performed, a high (H) level initialization mode signal DFT is generated from initialization control unit 24. A sense amplifier driving circuit 20 sets a sense amplifier driving signal PC, NC to the high-impedance state, equalization control signal generating unit 22 maintains the equalization control signal φE on the H-level, and bit line driving circuit 26 sets precharge feed line BLR on Vcc (H-level) or Vss low (L) level). In this way, in the memory cell array, the operation of sense amplifier SAi of each row stops, and transistors TR3, TR4, TR5 of precharge circuit PRi are ON, while voltage Vcc or Vss of precharge feed line BLR is fed to two bit lines BLi, BLi- through transistors TR1, TR2. In this state, the word line WLj of the assigned column is activated.

10 Claims, 3 Drawing Sheets

SEMICONDUCTOR MEMORY DEVICE AND MEMORY INITIALIZING METHOD

This invention concerns a semiconductor memory device and an initialization method of the stored information for the memory cell array thereof.

BACKGROUND OF THE INVENTION

In the device test of a semiconductor memory device, the various memory cells must have the prescribed value as their stored information. However, when the power source is turned on, the value becomes undetermined for each memory cell. Consequently, before performing the test, it is necessary to initialize the semiconductor memory device by writing a prescribed datum (0 or 1) into all of the memory cells. For conventional semiconductor memory devices, such as one of the DRAM type, the memory cell region is divided into multiple memory blocks known as memory cell arrays. Consequently, initialization has to be performed for each memory cell array respectively.

FIG. 5 is a diagram illustrating a typical configuration of a DRAM memory cell array. In this figure, for simplifying the explanation, the array size is schematically represented by 16 columns (X-address) and 8 rows (Y-address). In this memory cell array, for each row a pair of complementary bit lines BLi, BLi- are connected via transfer gates TR1 and TR2 to a differential sense amplifier SAi and a precharge circuit PRi arranged for the row. At the cross points between one bit line BLi and even-numbered word lines WL0, WL2, . . . WL14, memory cells in the even-numbered columns MCi,0, MCi,2, . . . MCi,14 are connected. On the other hand, at the cross points between other bit line BLi- and odd-numbered word lines WL1, WL3, . . . WL15, memory cells in the odd-numbered columns MCi,1, MCi,3, . . . MCi,15 are connected, and the overall memory cell array has 8 rows×16 columns of memory cells arranged in a matrix configuration. Each memory cell MCi,j comprises one transistor and one storage capacitor.

With respect to FIG. 6, the data read/write operation into the memory cells of this memory cell array can be explained. As far as the standby state before the read/write operation is concerned, the equalization control signal $\phi E$ is at the high (H) level, and transistors TR3, TR4, TR5 of precharge circuit PRi of each row are ON. A voltage of Vcc/2 is applied to precharge voltage feed line BLR. From this voltage feed line BLR, bit lines BLi, BLi- of each line are precharged with a voltage of Vcc/2 via transistors TR3, TR4, TR5. When external row address strobe signal RAS- falls to the low L level for read/write operation, equalization control signal $\phi E$ correspondingly assumes the L-level, and transistors TR3, TR4, TR5 of precharge circuit PRi of each row are turned OFF. Then, word line WLj of the selected column is activated, and the potential of the bit line (such as BLi-) varies corresponding to the stored information in the various memory cells MC0,j, MC1,j, . . . MC7,j connected to said word line WLj. In the example shown in FIG. 6, the stored information is "0," and the potential of bit line BLi- changes a little from the level of Vcc/2 to the lower side.

Then, while one sense amplifier driving signal NC is pushed down to Vss (L-level voltage), the other sense amplifier driving signal PC is pulled up to Vcc (H-level voltage). Corresponding to this change, for sense amplifier SA of each row, the bit line potential is amplified to the potential of the digital logic so that one of the bit line pair BLi, BLi- is pushed down to Vss, while the other is pulled up to Vcc. At this time, since signal $\phi T$ is at the high level, transistors TR1, TR2 are in ON state, and the bit line pair BLi, BLi- is connected to sense amplifier SAi. In the example shown in FIG. 6, since the stored information of the memory cell connected to bit line BLi- is "0", bit line BLi- is pulled down to Vss (L-level voltage). On the other hand, bit line BLi is pulled up to Vcc (H-level voltage).

Then, in the row selected by Y-address, Y-address line YSi is activated, so that transfer gates TR6, TR7 of the row are turned ON, and sense amplifier SAi of the row is connected to data input/output line I/O. In this way, in the case of write operation, the datum from data input/output line I/O is sent to bit line BLi- through transistor TR6, sense amplifier SAi and transfer gate TR1, and it is written into memory cell MCi,j at the intersection of bit line BLi- and word line WLj. In the case of read operation, the datum read from memory cell MCi,j to bit line BLi- is sent out to data input/output line I/O through transfer gate T1, sense amplifier SAi, and transistor gate TR6.

In order to perform initialization for the aforementioned memory cell array, the following three methods have been heretofore adopted.

(1) Initialization by means of a normal write operation
(2) Initialization by means of a parallel write operation
(3) Initialization by means of a test operation (column or row copy mode)

In the initialization by means of the normal write operation, the aforementioned write operation is carried out for all of the memory cells. Consequently, for the memory cell array shown in FIG. 5, the write cycle is repeated 16×8 times. For the overall memory device, the number of the write cycles that have to be performed corresponds to the volume of the memory device. For example, for a 64 Mbit memory, it is necessary to perform $64 \times 10^6$ write cycles.

In the initialization by means of the parallel write operation, in the aforementioned write operation, after driving of sense amplifiers SA0–SA7 of each row, for the row selected by the Y-address, such as row 0, multiple (such as two) Y-address lines YS0, YS4 are selected in parallel, and data are written into the two memory cells MC0,j, MC4,j in parallel (at the same time). Consequently, compared with the scheme of initialization by means of normal write operation, the number of write cycles can be halved.

In the method of initialization by means of the test operation, first of all, the normal operation or parallel-write operation is performed so that the data are written into all of the memory cells MC0,0, MC1,0, . . . MC7,0 connected to a word line, such as column 0 word line WL0. Then, it enters the test operation mode by means of control using WE/CAS-before-RAS [control], etc. In the test operation mode, the stored data in memory cells MC0,0, MC1,0, . . . MC7,0 connected to word line WL0 are read to bit lines BL0, BL1, . . . BL7, respectively. The read stored data are latched in sense amplifiers SA0–SA7 of each row, respectively. Then, while driving of various sense amplifiers SA0–SA7 is continued, the X-addresses of the even-numbered columns of column 2 through column 14 are scanned, and word lines WL0, WL2, . . . WL14 are sequentially activated, and sequential write operation is performed so that the stored data of column 0 are copied to the other even-numbered columns. Then, the same operation is repeated for the odd-numbered columns. That is, first of all, the data are written into all of the memory cells in column 1, MC0,1, MCI,1, . . . MC7,1; then, these stored data in column 1 are copied in sequence to the memory cells of the other odd-numbered columns via sense amplifiers SA0–SA7 and bit lines BL0-, BLi-, . . . BL7- of each row.

However, in the device testing of recently developed semiconductor memory devices, there is a demand to shorten the test time as the memory volume is increased, and hence there is a demand to shorten the time for initialization. All of the conventional methods, however, fail to meet this demand for shortening the initialization time.

In particular, for the initialization method using the normal write operation, as the number of the develop cycles is equal to the number of the memory cells, a long time is needed.

For the initialization method using the parallel write operation, although the time needed in this case can be halved or even reduced to a small fraction with respect to the time needed in the initialization method using the normal write operation, there is nevertheless a limit on the ratio corresponding to the parallel number, and the time cannot be further shortened.

In this respect, for the initialization operation using the test operation, since the data written into the memory cells of one column are copied to the memory cells of the other columns, the time-shortening effect is significant. However, even in this case, it is necessary to perform the read/write operation in two rounds for the memory cells in the even-numbered columns connected to bit lines BL0, BL1, ... BL7 and for the memory cells in the odd-numbered columns connected to bit lines BL0-, BLi-, ... BL7-, respectively. Also, in recently developed DRAMs, in order to prevent noise caused by parasitic capacitance among the bit lines, a twist configuration is usually adopted. In this configuration, the complementary bit lines BLi, BLi- of each row are twisted once after a prescribed distance so that their positions are exchanged. In this configuration, the connection configuration between the bit line and the word line is inverted at each twist site. Consequently, in order to write the same datum (physical logic value) into all of the memory cells, it is necessary to perform the write/transfer operation for each divided twist region, respectively. As a result, control becomes very complicated, and the effect in shortening the time becomes less significant. This is a disadvantage.

OBJECT OF THE INVENTION

It is an object of this invention to provide a type of semiconductor memory device and an initialization method therefor, wherein writing the initializing data into the memory cells can be performed simply and in a short period of time, and the initialization time can be significantly reduced while the basic circuit configuration can be maintained for the peripheral circuit of the memory cell array.

SUMMARY OF THE INVENTION

The invention provides a type of semiconductor memory device in which the semiconductor memory device has memory cells for storing information, word lines for selecting the aforementioned memory cells, and a complementary bit line pair which is connected to any one side of the aforementioned memory cell. With the aid of the complementary logic value of the aforementioned complementary bit line pair, an information read operation or write operation is performed. In this semiconductor memory device, there is an initializing means which can make both bit lines of the aforementioned complementary bit line pair have the same binary logic value at either the high level or the low level.

Also, this invention provides an initialization method for semiconductor memory devices of the type in which, for the memory cell array made of multiple memory cells arranged in matrix configuration, a pair of bit lines of the memory cell array are connected to the sense amplifier for each row. In this initialization method, when the aforementioned pair of bit lines are set on virtually the same voltage level when the operation of the sense amplifier is paused for each row, the word lines are activated for one line or multiple lines in each cycle of operation, and the data of the same logic value are written into the memory cells in the various rows and various columns.

In the semiconductor memory device of this invention, by means of the initializing means, both bit lines of the complementary bit line pair are forced to have the same logic value (high level or low level). In this state, when a certain word line is energized, the same datum is written into the memory cells connected to both bit lines of the complementary bit line pair by simply energizing the same multiple [word] lines (or all [the word lines] can be energized at the same time) for all of the memory cells selected by this word line.

According to this invention, when the initialization is performed, while the operation of the sense amplifiers is paused, that is, no sense amplifier driving voltage is applied to the memory cells, the bit line pair of each row are set to almost the same voltage level (H level or L level). In this state, when a certain word line is activated, the datum having a physical logic value corresponding to the aforementioned voltage level is written into all of the memory cells connected to the word line. Consequently, when the word lines are sequentially activated one line or multiple lines at a time (they may also be activated all at the same time), the data with the same logic value are written into the memory cells of the various rows and columns.

In the case when the bit line pairs for each row are set on virtually the same voltage level through the precharge circuit of the row, the basic circuit of the peripheral circuit of the memory array can be directly used.

Figure 1:
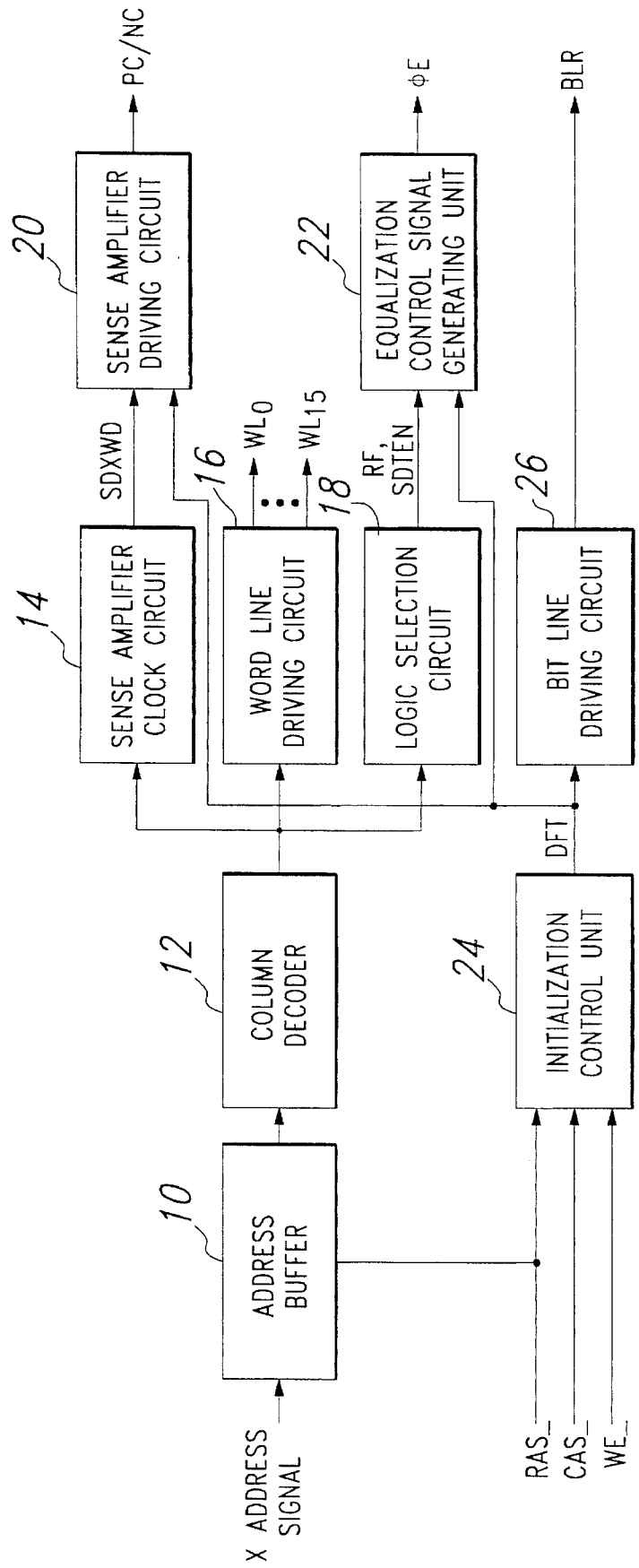
FIG. 1 is a block diagram illustrating the circuit configuration of the equipment used for performing initialization in an embodiment of this invention.

In reference numerals as shown in the drawings:
16, word line driving circuit
18, block selection control unit
20, sense amplifier driving circuit
22, equalization control signal generating unit
24, initialization control unit
26, bit line driving circuit
SA0, sense amplifier
PR0, precharge circuit

DESCRIPTION OF PREFERRED EMBODIMENT

An embodiment of the invention will be explained with reference to FIGS. 1–4. In this embodiment, for simplicity of explanation, the method for initializing the memory cell array shown in FIG. 5 is explained.

Figure 5:
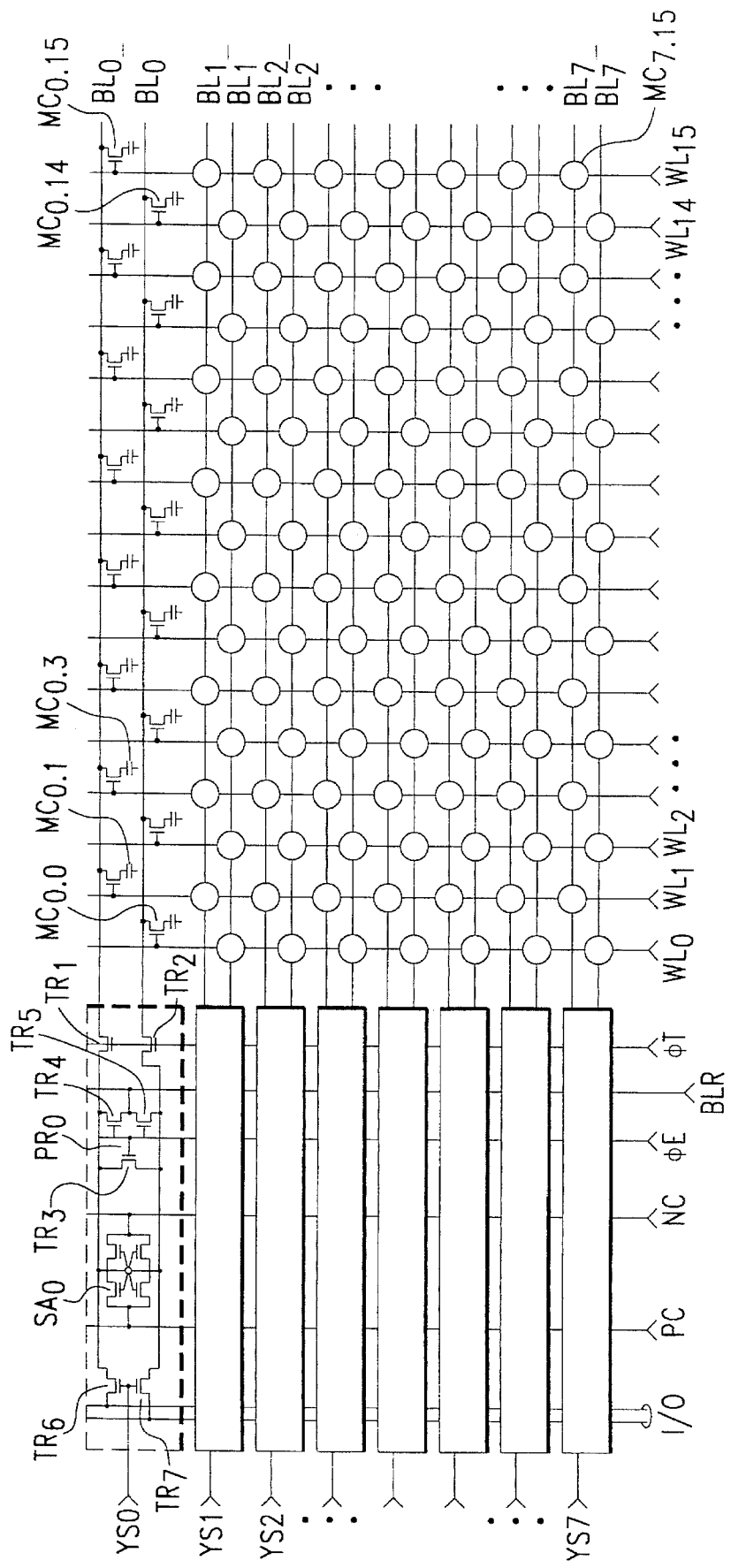
FIG. 5 is a diagram illustrating the circuit configuration of a typical memory cell array of a DRAM.

FIG. 1 illustrates the circuit configuration of a device used for initializing the memory cell array shown in FIG. 5 in this embodiment. In this device, address buffer 10, column decoder 12, sense amplifier block circuit 14, word line driving circuit 16, clock selection control unit 18, sense amplifier driving circuit 20, equalization control signal generating unit 22, and bit line driving circuit 26 are circuits which can also be used for write, read, and refreshing operations in addition to the initialization operation. Also, the circuit configuration of address buffer 10, column decoder 12, sense amplifier block circuit 14, word line driving circuit 16, clock selection control unit 18, and initialization control unit 24 may be similar to that in a conventional memory. On the other hand, sense amplifier driving circuit 24, equalization control signal generating unit 22, and bit line driving circuit 26 are specifically applicable for performing an initialization operation in this embodiment in accordance with the invention.

In address buffer 10, with row address strobe signal RAS- used as the strobe signal, the X-address signal among the memory address signals is input from address bus (not shown in figure). The X-address signal input to address buffer 10 is decoded by means of column decoder 12, and when the X-address signal assigns the column within the memory cell array, sense amplifier clock circuit 14, word line driving circuit 16 and block selection control unit 18 perform the following prescribed operations, respectively.

That is, sense amplifier clock circuit 14 generates H-level timing signal SDXWD for operating sense amplifiers SA0–SA7 of the various rows. Word line driving circuit 16 activates word line WLi of the column assigned by the X-address signal. Block selection control unit 18 generates H-level control signal RF, SDTEN for temporarily pausing the Vcc/2 recharge with respect to the bit lines during the memory access period in the aforementioned memory cell array.

Initialization control unit 24 generates H-level initialization mode signal DFT, which is used for entering the initialization mode in the case when WE/CAS before RAS control, i.e., write control signal WE- and column address strobe signal CAS- fall faster than row address strobe signal RAS-. This initialization mode signal DFT is fed to sense amplifier driving circuit 20, equalization control signal generating unit 22, and bit line driving circuit 26.

Figure 2:
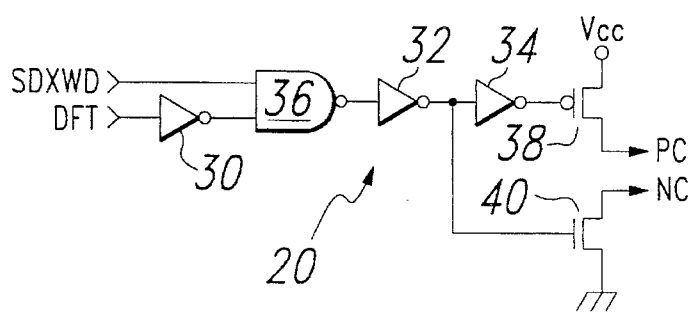
FIG. 2 is a circuit diagram illustrating the circuit configuration of a sense amplifier driving circuit in the equipment shown in FIG. 1.
Figure 3:
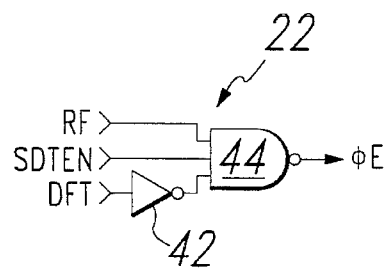
FIG. 3 is a circuit diagram illustrating the circuit configuration of an equalization control signal generating unit in the equipment shown in FIG. 1.
Figure 4:
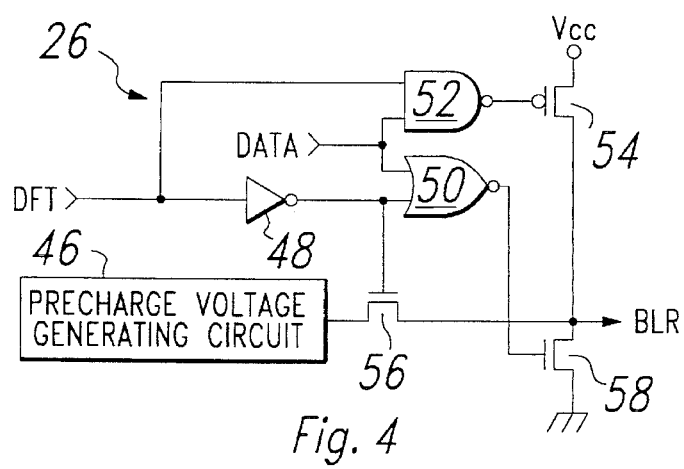
FIG. 4 is a circuit diagram illustrating the circuit configuration of a bit line driving circuit in the equipment shown in FIG. 1.
Figure 6:
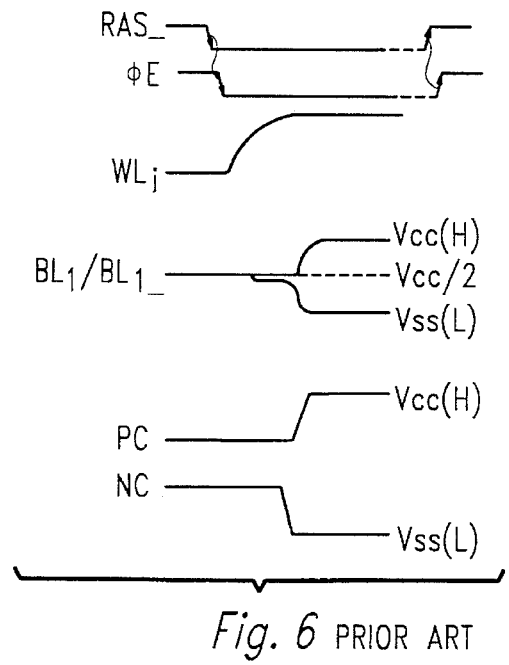
FIG. 6 is a waveform diagram illustrating the signals at the various parts in the case of a write/read operation in the memory cell array shown in FIG. 5.

FIGS. 2, 3, and 4 illustrate the circuit configurations of sense amplifier driving circuit 20, equalization control signal generating unit 22, and bit line driving circuit 26, respectively.

As shown in FIG. 2, sense amplifier driving circuit 20 comprises inverters 30, 32, 34, NAND circuit 36, p-type MOS transistor 38, and n-type MOS transistor 40. One input terminal of NAND circuit 36 is connected to the output terminal of sense amplifier clock circuit 14, and the other input terminal is connected via inverter 30 to the output terminal of initialization control unit 24.

During the period when the initialization operation is not performed, output signal DFT of initialization control unit 24 assumes the L-level. Consequently, an H-level voltage is applied from inverter 30 to the other input terminal of NAND circuit 36. Consequently, when a write/read operation is performed, H-level timing signal SDXWD is sent from sense amplifier clock circuit 14, and the output signal of NAND circuit 36 assumes the L-level. In this way, while p-type MOS transistor 38 is turned ON via inverters 32, 34, n-type MOS transistor 40 is turned ON via inverter 32. As a result, via p-type MOS transistor 38, power source voltage Vcc is applied as one sense amplifier driving signal PC, and via n-type MOS transistor 40, ground potential Vss is applied as the other sense amplifier driving signal NC to sense amplifiers SA0–SA7 of each row, respectively, and these sense amplifiers SA0–SA7 are operated.

However, as the initialization is performed, output signal DFT of initialization control unit 24 assumes H-level. Consequently, the output signal of NAND circuit 36 is forced to H-level. In this case, both p-type MOS transistor 38 and n-type MOS transistor 40 are turned OFF, their output terminals PC, NC become high impedance, and the operation stops for sense amplifiers SA0–SA7 of each row. In this way, as the initialization is performed, timing signal SDXWD from sense amplifier clock circuit 14 is masked by initializing mode signal DFT from initialization control unit 24.

As shown in FIG. 3, equalization control signal generating unit 22 comprises inverter 42 and NAND circuit 44. The first and second input terminals of the NAND circuit are connected to the output terminal of block selection unit 18, and the third input terminal of NAND circuit 44 is connected to the output terminal of initialization control unit 24 via inverter 42.

During the period when the initialization operation is not performed, output signal DFT of initialization control unit 24 assumes the L-level. Consequently, an H-level voltage is applied from inverter 42 to the third input terminal of NAND circuit 36. Consequently, when a write/read operation is performed, H-level control signal RF, SDTEN for temporarily pausing Vcc/2 precharging during the memory access period to the aforementioned memory cell array is sent from block selection unit 18 to the first and second input terminals of NAND circuit 44 in synchronization with RAS-, and the output signal of NAND circuit 44, that is, equalization control signal φE, assumes the L-level. In this way, transistors TR1, TR2, TR3 of precharge circuits PRi for the various rows of the memory cell array are turned OFF, and bit lines BLi, BLi- are blocked from precharge feed line BLR. In this way, when a certain word line is activated, the data stored in the various memory cells connected to it are read from one of bit lines BLi, BLi-.

When the initialization is performed, output signal DFT of initialization control unit 24 assumes H-level. Consequently, the output signal of NAND circuit 44, that is, equalization control signal φE, is kept on the H-level. As a result, transistors TR1, TR2, TR3 of precharge circuits PRi of each row are kept ON, while bit lines BLi and BLi- are kept in the state of connection to precharge feed line BLR. In this way, when the initialization is performed, control signal RF, SDTEN from block selection unit 18 is masked by initialization mode signal DFT from initialization control unit 24.

As shown in FIG. 4, bit line driving circuit 26 is made of precharge voltage generating circuit 46, inverter 48, NOR circuit 50, NAND circuit 52, p-type MOS transistor 54, and n-type MOS transistors 56, 58. Precharge voltage generating circuit 46 always generates an output voltage of Vcc/2.

During the period in which the initialization is not performed, signal DFT from initialization control unit 24 assumes L-level. Consequently, the output voltage of inverter 48 assumes H-level, the output voltage of NOR circuit 50 assumes L-level, and the output voltage of NAND circuit 52 assumes H-level. As a result, n-type MOS transistor 56 is ON, and p-type MOS transistor 54 and n-type MOS transistor 58 are locked in the OFF state, respectively.

Consequently, output voltage Vcc/2 of precharge voltage generating circuit 46 is sent to precharge feed line BLR via n-type MOS transistor 56.

When the initialization is performed, as DFT assumes H-level, the output voltage of inverter 48 assumes L-level, and n-type MOS transistor 56 is turned OFF. On the other hand, NOR circuit 50 and NAND circuit 52 become enabled, respectively, and their output voltages depend on the logic value of the initialization DATA. When logic value 1 (H-level) is given as the initialization DATA, the output voltage of NOR circuit 50 is at L-level, and n-type MOS transistor 58 is OFF. On the other hand, with the output voltage of NAND circuit 52 at the L-level, p-type MOS transistor 54 is turned ON. As a result, power source voltage Vcc as logic value 1 (H-level) is sent to precharge feed line BLR via p-type MOS transistor 54. Also, when logic value 0 (L-level) is given as the initialization DATA, with the output voltage of NAND circuit 52 on the H-level, p-type MOS transistor 54 is turned OFF. On the other hand, with the output voltage of NOR circuit 50 on the H-level, n-type MOS transistor 58 is turned ON. As a result, ground potential Vss of logic value 0 (L-level) is sent to precharge feed line BLR via n-type MOS transistor 58.

In this way, when the initialization is performed, as H-level initialization mode signal DFT is generated from initialization control unit 24 corresponding to WE/CAS-before-RAS control, sense amplifier driving circuit 20 sets output signals (sense amplifier driving signals) PC, NC as in the high-impedance state, equalization control signal generating unit 22 maintains output signal (equalization control signal) φE on the H-level, and bit line driving circuit 26 sets precharge feed line BLR to either Vcc (H-level) or Vss (L-level) corresponding to the logic value of the initialization DATA. In this way, in the memory cell array, the operation of sense amplifier SAi for each row stops, and, with precharge circuit PRi in the through state, that is, with transistors TR1, TR2, TR3 ON, Vcc (H-level) or Vss (L-level) is fed from precharge feed line BLR to two bit lines BLi, BLi- through transfer gates TR1, TR2, respectively. In this state, when word line driving circuit 16 activates word line WLj assigned by the X-address signal, a datum of logic value of 1 or 0 is written into all of the memory cells MC0,j–MC0,7 connected to said word line WLj. Consequently, as the value of the X-address signal is incremented, and word lines WL0, WL1, ... WL15 are activated in order, data with the same physical logic value (1 or 0) are written into all of the memory cells in the memory cell array. The order in which activation of word lines WL0, WL1, ... WL15 is performed may be selected at will. They may be activated one word line or several word lines each time, or they may also be activated all at the same time.

In this way, in the initialization in this embodiment, while the operation of sense amplifier SAi of each row stops, the same level of voltage is sent from precharge feed line BLR to bit line pair BLi, BLi- though precharge circuit PRi of the corresponding row; hence, word lines WL0, WL1, ... WL15 are activated either in order or at the same time, and data of the same physical logic value (1 or 0) are written into the memory cells of the various rows and various columns. As a result, for either memory cells connected to one bit line BLi or memory cells connected to other bit line BLi-, for either even-numbered columns or odd-numbered columns, and irrespective of whether the twist configuration is adopted or not, all of the word lines can be activated either in order or at the same time without interruption. Consequently, data of the same logic value can be written into the memory cells of the various rows and columns in a short time. As a result, it is possible to perform writing to all of the memory cells with a write cycle number equal to the refresh cycle number (4K or 8K cycles for a 64 Mbit DRAM), and the time needed for initialization can be significantly reduced.

When the initialization is not performed, initialization mode signal DFT from initialization control unit 24 is in the disabled state (L-level), and the steady-mode operation is performed for sense amplifier driving circuit 20, equalization control signal generating unit 22 and bit line driving circuit 26 for write, read, or refreshing. In this way, for the equipment of this embodiment shown in FIG. 1, the basic circuit configuration of the peripheral circuit of the memory cell array can be maintained, and this is beneficial for the design and manufacturing of the circuit.

In the aforementioned embodiment, the initialization mode is set by means of WE/CAS-before-RAS control. However, other methods may also be used for setting the initialization mode. For example, the method in which a certain pin of the semiconductor memory device is maintained higher than the power source voltage or the method in which a prescribed address is input may be adopted.

In the aforementioned embodiment, the equipment shown is for initialization of the memory cell array shown in FIG. 5. However, it is possible to adopt various other forms for the sense amplifier and precharge circuit. For example, in the aforementioned embodiment, precharging is performed for the complementary bit lines BLi, BLi- from a common precharge feed line BLR through precharge circuits PR0–PR7 of the row. However, it is also possible to adopt the following scheme in place of the aforementioned scheme using a common precharge feed line BLR: for each row, complementary bit lines BLi, BLi- may be charged to Vcc/2, Vcc, or Vss directly from power source voltage Vcc or Vss. Also, this invention is not limited to a DRAM, it may be adapted to an SRAM or other semiconductor memory devices as well.

According to the invention, with the bit line pair of each row on almost the same voltage level (high-level or low-level), the word lines can be activated either one by one or several lines at a time, and the data of the same logic value may be written into the memory cells of the various rows and columns. Consequently, there is no need to distinguish between the even-numbered and odd-numbered columns for each twist region, and the initialization operation can be performed simply in a short period of time. Also, the initialization data are written through the precharge circuit of each row, and the basic circuit of the memory cell array can be used.

I claim:

1. A semiconductor memory device comprising;

an array of memory cells arranged in a matrix of rows and columns of individual memory cells;

a pair of complementary bit lines for each of said rows of memory cells and connected to the same side of each of the memory cells included in a respective row;

a plurality of word lines corresponding to the columns of memory cells and arranged orthogonally with respect to the pairs of complementary bit lines for each of said rows of memory cells;

a plurality of cross points defined by the intersections formed between the orthogonally related word lines and pairs of complementary bit lines;

one-half of the columns of memory cells being connected at the respective cross points between one bit line of the pair of complementary bit lines and the word lines corresponding to said one-half of the columns of memory cells;

the other half of the columns of memory cells being connected at the respective cross points between the other bit line of the pair of complementary bit lines and the word lines corresponding to the said other half of the columns of memory cells;

said pairs of complementary bit lines for each of said rows of memory cells normally having complementary logic values in the performance of read and write operations of the semiconductor memory device;

initializing means operably connected to said pairs of complementary bit lines for establishing the same binary logic value at either the high level "1" or the low level "0" for both of the bit lines included in each of said pairs of complementary bit lines at the same time; and means for selecting at least one word line for writing the same binary logic value into each of the respective memory cells connected to both bit lines of the complementary bit line pair.

2. A semiconductor memory device as set forth in claim 1, wherein said pairs of complementary bit lines for each of the memory cells included in each of a plurality of said rows of memory cells are operated upon by said initializing means for establishing the same binary logic value at either the high level "1" or the low level "0" for both of the bit lines included in each of said pairs of complementary bit lines at the same time; and said word line selecting means selecting a plurality of word lines at the same time such that the binary logic value written into each of the memory cells included in the respective rows corresponding to the selected word lines is the same binary logic value.

3. A semiconductor memory device as set forth in claim 2, wherein said word line selecting means selects all of the word lines at the same time such that the same binary logic value is written into each of the memory cells included in said array of memory cells at the same time.

4. A semiconductor memory device as set forth in claim 1, wherein the even-numbered columns of memory cells are said one-half of the columns connected at the respective cross points between one bit line of the pair of complementary bit lines and the word lines corresponding to said one-half of the columns of memory cells; and the odd-numbered columns of memory cells are said other half of the columns of memory cells connected at the respective cross points between the other bit line of the pair of complementary bit lines and the word lines corresponding to the said other half of the columns of memory cells.

5. A semiconductor memory device as set forth in claim 1, wherein said initializing means operably connected to said pairs of complementary bit lines establishes a binary logic value at the high level "1" for both of the bit lines included in each of said pairs of complementary bit lines at the same time.

6. A semiconductor memory device as set forth in claim 1, further including a differential sense amplifier for each row of memory cells and connected to the pair of complementary bit lines for that row.

7. A method of initializing a semiconductor memory device to test for the stored information in the semiconductor memory device, said method comprising:

providing an array of memory cells arranged in a matrix of rows and columns of individual memory cells;

associating a pair of bit lines for each of the rows of memory cells and connected to a differential sense amplifier for the respective row of memory cells;

arranging one-half of the columns of memory cells connected at respective cross points between one bit line of the pair of bit lines and the word lines corresponding to said one-half of the columns of memory cells;

arranging the other half of the columns of memory cells connected at the respective cross points between the other bit line of the pair of bit lines and the word lines corresponding to the said other half of the columns of memory cells; and initializing the memory cells included in at least one row corresponding to a word line, the initializing of the memory cells including setting each of the bit lines included in respective pairs of bit lines associated with the memory cells included in a row to substantially the same voltage level representative of one of two binary logic values as a high level "1" or a low level "0", activating at least one word line of said plurality of word lines, and writing data of the same logic value as set in the respective pairs of bit lines into each of the memory cells included in said at least one row simultaneously.

8. A method as set forth in claim 7, wherein the arrangement of one-half of the columns of memory cells connected at the respective cross points between one bit line of the pair of bit lines and the word lines corresponding to said one-half of the columns of memory cells includes the even-numbered columns of memory cells; and the arrangement of the other half of the columns of memory cells connected at the respective cross points between the other bit line of the pair of bit lines and the word lines corresponding to the said other half includes the odd-numbered columns of memory cells.

9. A method of initializing a semiconductor memory device to test for the stored information in the semiconductor memory device, said method comprising:

providing an array of memory cells arranged in a matrix of rows and columns of individual memory cells;

associating a pair of bit lines for each of the rows of memory cells and connected to a differential sense amplifier for the respective row of memory cells; and initializing the memory cells included in a plurality of rows corresponding to a plurality of word lines, the initializing of the memory cells including setting each of the bit lines included in respective pairs of bit lines associated with the memory cells included in the respective rows of the plurality of rows to substantially the same voltage level representative of one of two binary logic values as a high level "1" or a low level "0", activating said plurality of word lines corresponding to respective columns of memory cells of said array of memory cells at the same time, and writing data of the same logic value as set in the respective pairs of bit lines into each of the memory cells included in the rows and columns of memory cells simultaneously in accordance with the activated plurality of word lines.

10. A method as set forth in claim 9, wherein all of the word lines are activated at the same time; and writing data of the same logic value at the same time into all of the memory cells included in the array of memory cell.

* * * * *